United States Patent [19]
Suzuki et al.

[11] 4,320,348
[45] Mar. 16, 1982

[54] VARIABLE LEVEL CONVERTER

[75] Inventors: Shinjiro Suzuki; Tadashi Yoshikawa; Tsuguo Otsuki, all of Yokohama; Masao Takeda, Hachioji; Nobuhisa Kamoi, Yokohama; Kazuo Satoh, Kawasaki, all of Japan

[73] Assignee: Fujitsu Limited, Kanagawa, Japan

[21] Appl. No.: 70,608

[22] Filed: Aug. 29, 1979

[30] Foreign Application Priority Data

Aug. 29, 1978 [JP] Japan .................. 53-105137

[51] Int. Cl.³ ............................................. H03G 3/30
[52] U.S. Cl. ..................................... 330/52; 330/284
[58] Field of Search .................. 330/52, 132, 133, 144, 330/145, 284; 455/249

[56] References Cited
U.S. PATENT DOCUMENTS 3,360,737 12/1967 Harris et al. ..................... 330/52
3,671,886 6/1972 Fudemoto et al. ............. 330/145 X

OTHER PUBLICATIONS

Stadnik, "A Phase-Shift Generator," *Instruments and Experimental Techniques*, vol. 17 No. 6, Pt. 2, Nov.--Dec. 1974 (Publ. May 1975), pp. 1710-1711.

*Primary Examiner*—James B. Mullins
*Attorney, Agent, or Firm*—Staas & Halsey

[57] ABSTRACT

A variable level converter comprising a first variable level converting unit, a second variable level converting unit and an amplifying transistor connected therebetween. Each of the first and second variable level converting units comprises an inverted L-type variable attenuator which includes a variable impedance element. Each variable impedance element is controlled by the same level control signal and has the same electric characteristics.

2 Claims, 4 Drawing Figures

VARIABLE LEVEL CONVERTER

BACKGROUND OF THE INVENTION

1. Field of the Invention

The present invention relates to a variable level converter, and more particularly relates to a level adjusting circuit which is preferably utilized in an AGC (Automatic Gain Control) circuit having a negative feedback loop therein.

2. The Prior Art

The variable level converter is one of the most important circuit units in various kinds of electronically controlled apparatuses. This variable level converter is generally comprised of a conventional variable impedance element, such as an FET (Field Effect Transistor), and a diode or a transistor. The variable level converter is usually used for, firstly, converting the level of a signal to the other desired signal level in dependence upon an external level specifying signal, and secondly for creating the AGC circuit together with an amplifier. In the AGC circuit an output level of the amplifier is supplied, as a level specifying signal, to the variable level converter, by way of the feedback loop, so as to keep the output level at a desired constant.

Such a variable level converter is widely employed in various kinds of electronically controlled systems, such as a microwave transmitting system, a microwave receiving system or a satellite communication system.

In the prior art, the variable level converter which is comprised of both one variable impedance element and the other circuit element, for example the so-called inverted L-type variable attenuator, has widely been known in the world. This variable level converter can convert the level of a signal to the other desired signal level; also the variable level converter can perform the AGC operation, by utilizing the so-called non-linear characteristics which is created by the variable impedance element. However, the variable level converter of the prior art has a defect. The defect is that it is difficult to obtain a wide range of level conversion. This is because, when the level is converted in a wide range, a deleterious non-linear distortion, especially a second-order non-linear distortion, is produced from the variable impedance element. In order to maintain a high quality level conversion, such a second-order non-linear distortion must be eliminated from the variable level converter. Further, it is required, for the variable impedance element, to have a wide range of impedance value variation so as to obtain a wide range of the level conversion. However, the more the impedance value varies in a wide range, the more the noise may increase, due to the second-order non-linear distortion.

SUMMARY OF THE INVENTION

Therefore, it is an object of the present invention to provide a variable level converter which can perform a wide range of level conversion without inducing the second-order non-linear distortion.

BRIEF DESCRIPTION OF THE DRAWINGS

The present invention will be more apparent from the ensuing description with reference to the accompanying drawings wherein.

DESCRIPTION OF THE PREFERRED EMBODIMENTS

Figure 1:
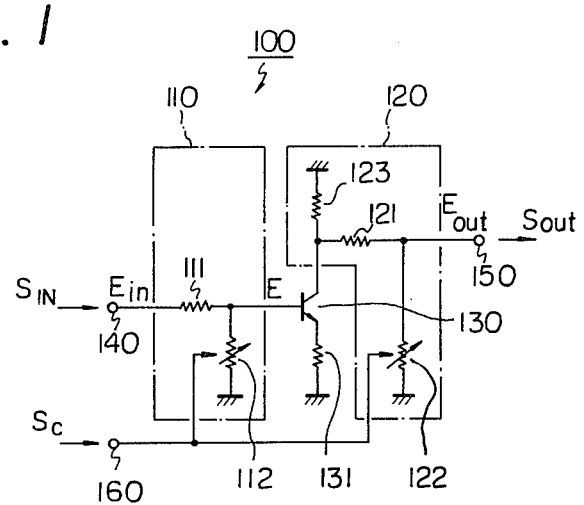
FIG. 1 illustrates a circuit diagram of a first embodiment of a variable level converter, according to the present invention.

In FIG. 1, which illustrates a circuit diagram of a first embodiment of the variable level converter according to the present invention, the variable level converter 100 is mainly comprised of a first variable level converting unit 110, a second variable level converting unit 120 and an amplifying transistor 130. The first unit 110 is comprised of a fixed resistor 111 and a first variable impedance element 112, such as an FET, a diode or a transistor. The second unit 120 is comprised of a first fixed resistor 121, a second variable impedance element 122, such as an FET, a diode or a transistor, and a second fixed resistor 123. The transistor 130 has both a fixed resistor 131, as an emitter resistor thereof, and a second fixed resistor 123, as a collector resistor thereof. Thus, the transistor 130 forms a grounded-emitter type amplified; however, a conventional dc biasing circuit for this amplifier is not shown in FIG. 1. An input signal $S_{in}$ is applied to the converter 100, via an input terminal 140, and then an output signal $S_{out}$ is produced therefrom, via an output terminal 150, under control of a control signal $S_c$ being supplied via a control terminal 160. The level of the input signal $S_{in}$ is converted to the level of the output signal $S_{out}$, in accordance with the control information indicating the specified value of the level of conversion, which is supplied as the control signal $S_c$.

The first unit 110 itself is known as an inverted L-type variable attenuator. Also the second unit 120 itself, except for the resistor 123, is known as an inverted L-type variable attenuator. The known inverted L-type variable attenuator has a defect, that is the level cannot be varied in a wide range without inducing the second-order non-linear distortion, which distortion is produced by the non-linear characteristics of the variable impedance element. In contrast, the variable level converter of the present invention can vary the level to be converted in a wide range without inducing the second-order non-linear distortion, and accordingly the above mentioned defect is eliminated. In order to eliminate the defect, the variable level converter satisfies the following five conditions.

(1) The converter 100 includes two independent variable impedance elements having identical electric characteristics.

(2) The two variable impedance elements are controlled by the same control signal.

(3) The levels of the signals to be applied to the two variable impedance elements are the same.

(4) The phases of the signals are opposite to each other by 180°.

(5) The transfer functions of the first unit and the second unit are the same.

The operational principle of the present invention will be clarified by the following explanations. The transfer function of the first unit 110 is expressed by the following equation. That is, $$f(RV_1) = \frac{RV_1}{R_1 + RV_1} \qquad (1)$$

where the symbol $RV_1$ represents the resistance value of the first variable impedance element 112, and the symbol $R_1$ represents the resistance value of the resistor 111.

Similarly, the transfer function of the second unit 120 is expressed by the following equation. That is, $$f(RV_2) = \frac{RV_2}{R_2 + RL + RV_2} \qquad (2)$$

where the symbol $RV_2$ represents the resistance value of the second variable impedance element 122, the symbol $R_2$ represents the resistance value of the resistor 121 and the symbol RL represents the resistance value of the resistor 123. Then the total transfer function of the converter 100 is expressed by the following equation. That is, $$f(RV_1, RV_2) = \frac{E_{out}}{E_{in}} = \qquad (3)$$

$$\left(\frac{RV_1}{R_1 + RV_1}\right) \cdot \frac{RL}{R_e} \cdot \left(\frac{RV_2}{R_2 + RL + RV_2}\right)$$

where the symbol $R_e$ represents the resistance value of the resistor 131. The symbols $E_{in}$ and $E_{out}$ represent the values of the voltages of the input signal $S_{in}$ and the output signal $S_{out}$, respectively. In the above equation (3), the total transfer function $f(RV_1, RV_2)$ is the product of the function $f(RV_1)$, that is $$\frac{RV_1}{R_1 + RV_1},$$

a ratio between the resistors 123 and 131, that is $$\frac{RL}{R_e},$$

and the transfer function $f(RV_2)$, that is $$\frac{RV_2}{R_2 + RL + RV_2}.$$

The above mentioned ratio $$\frac{RL}{R_e}$$

corresponds to the value of a gain of the amplifier which is comprised of the transistor 130.

With regard to the resistance values $RV_1$ and $RV_2$, these values $RV_1$ and $RV_2$ should satisfy the following equation (4), in order to satisfy the aforesaid conditions state in paragraphs (1) and (2).

$$RV_1 = RV_2 = RV_c \qquad (4)$$

where the $RV_c$ is the resistance value of a variable element, when it is controlled by a nominal control signal. Also, the resistance values $R_1$ and $(RL+R_2)$ should be selected so as to satisfy the following equation (5), in order to satisfy the aforesaid condition stated in paragraph (5).

$$R_1 = RL + R_2 = R_c \qquad (5)$$

where the $R_c$ is a constant. Then the total transfer function $f(RV_1, RV_2)$ of the converter 100 is expressed by the following equation (6)

$$f(RV_1, RV_2) = \frac{RL}{R_e} \cdot \left(\frac{RV_c}{R_c + RV_c}\right)^2 \qquad (6)$$

As will be understood from the above mentioned equations (1) and (6), the total transfer function $f(RV_1, RV_2)$ is the square of the transfer function of the single inverted L-type variable attenuator, that is the squared transfer function of the first unit 110, and at the same time, the total transfer function $f(RV_1, RV_2)$ which has a gain of $$\frac{RL}{R_e}$$

with respect to the above mentioned squared transfer function of the first unit 110.

Further, the resistance value $R_e$ can be selected to be some value (explained hereinafter), in order to satisfy the aforesaid condition stated in paragraph (3).

Lastly, the aforesaid condition stated in paragraph (4) can be satisfied by employing the grounded-emitter amplifier which includes the transistor 130. This is because the phase of the signal appearing at the collector of the transistor 130 differs, by 180°, from the phase of the signal being applied to the base thereof. Consequently, since the levels of the signals to be applied to the first and second variable impedance elements 112 and 122 are the same and at the same time the phases of said signals are phase with opposite phase with each other, the second-order non-linear distortion is cancelled and cannot be produced from the output terminal 150.

The reason why the second-order non-linear distortion cannot be produced from the output terminal 150, will be more apparent by referring to the following detailed description. Generally, the output voltage E (See FIG. 1) of the first unit 110 is expressed by the following equation (7).

$$E = a_1 E_{in} + a_2 E_{in}^2 + \ldots \qquad (7)$$

Similarly, the output voltage $E_{out}$ (see FiG. 1) of the second unit 120 is expressed by the following equation (8).

$$E_{out} = b_1(-E) + b_2(-E)^2 + \ldots \qquad (8)$$

The negative symbols "−" of the voltage E are derived from the fact that the phase of the signal appearing at the collector of the transistor 130 is opposite to the phase of the signal being applied to the base thereof. In the above equations (7) and (8), the coefficients $a_1$ and $b_1$ represent linear factors, such as a transmission gain or loss of the first and second variable impedance elements, respectively, also, the coefficients $a_2$ and $b_2$ represent the second-order non-linear distortion factors.

Accordingly, the factors $a_1$ and $b_1$ are represented by the following equations ⑨ and ⑩, respectively.

$$a_1 = \frac{RV_1}{R_1 + RV_1} \quad (9)$$

$$b_1 = \frac{RL}{R_e} \cdot \frac{RV_2}{(R_L + R_2 + RV_2)} \quad (10)$$

The equation ⑩ may be rearranged to the following equation ⑪ by substituting the equations ④ and ⑤ into the above mentioned equation ⑩.

$$b_1 = \frac{RL}{R_e} \cdot \frac{RV_1}{(R_1 + RV_1)} \quad (11)$$

The above mentioned equation ⑧ may be rearranged to the following equation ⑫ by substituting the equation ⑦ into this equation ⑧.

$$E_{out} = b_1(-a_1E_{in} - a_2E_{in}^2 \ldots) + b_2(-a_1E_{in} - a_2E_{in}^2 \ldots)^2 \quad (12)$$
$$= -a_1b_1E_{in} + (a_1^2b_2 - a_2b_1)E_{in}^2 + \ldots$$

Then the second-order non-linear distortion factor is derived from this equation 12. This factor is represented by the coefficient of $E_{in}2$, that is $(a_1^2b_2 - a_2b_1)$. It should be noted that if the factor $(a_1^2b_2 - a_2b_1)$ equals zero, the second-order non-linear distortion $(E_{in}^2)$ cannot be produced from the converter 100. The factor $(a_1^2b_2 - a_2b_1)$ can also be expressed by the following equation ⑬, that is $$a_1^2b_2 - a_2b_1 = a_1^2b_2 - a_1^2b_2b_1 = a_1^2b_2(1-b_1) \quad (13)$$

by using the fact that the value $a_2$ equals the value $a_1^2b_2$, that is $$a_2 = a_1^2b_2 \quad (14)$$

This is because the second-order non-linear distortion $a_2$ equals the product of $b_2$ and the square of the value of the transmission loss, that is the value $a_1$.

Therefore, in the above mentioned equation ⑬, the factor $(a_1^2b_2 - a_2b_1)$, or $a_1^2b_2(1-b_1)$, is made zero by selecting the value of $b_1$ to be equal to 1. In other words, from the equation ⑪, the value of $$\frac{RL}{R_e} \cdot \frac{RV_1}{(R_1 + RV_1)}$$

should be selected as being equal to 1. It should be remembered that in the previously mentioned statement, with reference to the equation ⑥, "the resistance value $R_e$ can be selected to be some value in order to satisfy the aforesaid condition stated in the paragraph (3)". At this time, said some value of $R_e$ is selected to be $$RL \cdot \frac{RV_1}{R_1 + RV_1},$$

because the value $$\frac{RL}{R_e} \cdot \frac{RV_1}{R_1 + RV_1}$$

should be equal to 1, in order to suppress the second-order non-linear distortion to zero.

As a result, the transfer function $f(RV_1, RV_2)$ of the converter 100 becomes the square of the function $f(RV_1)$ of the single inverted L-type variable attenuator (see the equation ⑥), and accordingly the level conversion ratio of the level may be twice the conversion ratio which is obtained by using the single inverted L-type variable attenuator. For example, the conversion ratio of such an attenuator is 20 dB, while the conversion ratio of the converter 100 becomes about 40 dB. As previously mentioned, with reference to the paragraph (3), the levels of the signals to be applied to the two variable impedance elements 112 and 122 must be the same. Such level coincidence is created by the amplifier comprised of the transistor 130, because the transmission loss in the unit 110 is compensated by the transistor 130. In this case, it is preferable to create the level coincidence completely, when it is desired to eliminate the second-order distortion completely. However, if it is not strictly desired to eliminate the second-order distortion completely, the levels of signals applied to the variable impedance elements 112 and 122 may be slightly different from each other.

Figure 2:
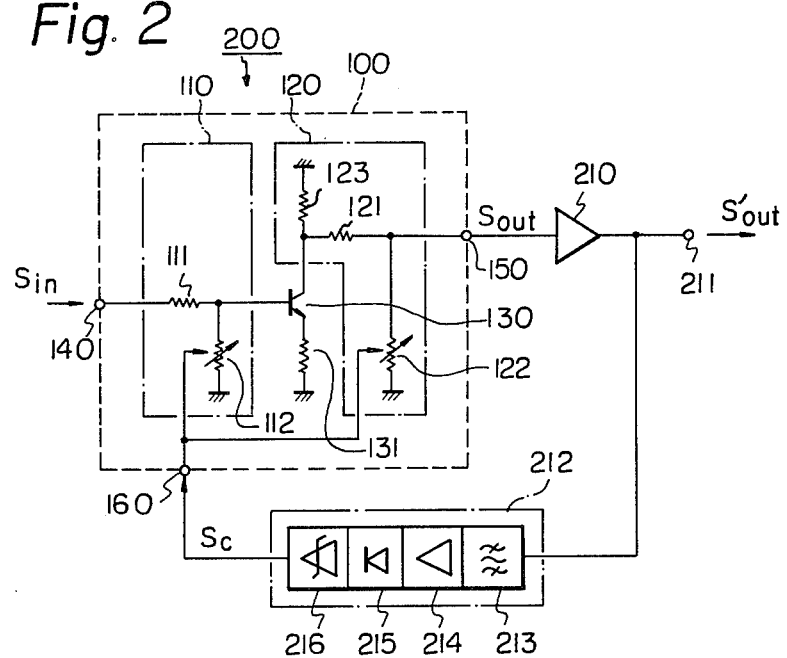
FIG. 2 illustrates a circuit diagram of a P-AGC (Pilot signal AGC) circuit which is constructed by utilizing the variable level converter of FIG. 1.

The variable level converter 100 may preferably be employed in an AGC circuit. The AGC circuit which utilizes the converter 100 is illustrated in FIG. 2. The AGC circuit 200 is especially directed to a P-AGC (Pilot signal AGC) circuit. In FIG. 2, members which have the same reference numerals or symbols as the those shown in FIG. 1 are identical with each other. The reference numeral 210 represents an amplifier having a fixed gain. An amplified signal $S_{out}$ from the amplifier 210 is, on the one hand, produced, as an output signal $S'_{out}$, from an output terminal 211, and, on the other hand, applied to a feedback circuit 212. The feedback circuit 212 comprises a pilot filter 213, a pilot signal amplifier 214, a rectifier 215 and an expander 216. The output signal from this feedback circuit 212 is applied, as the control signal $S_c$, to the control terminal 160. The pilot filter 213 operates so as to extract the pilot signal from the signal $S_{in}$. The extracted pilot signal is amplified by the pilot signal amplifier 214, and the amplified pilot signal is changed to a dc voltage pilot signal by the rectifier 215. The dc voltage pilot signal is converted to the expanded dc voltage pilot signal, by the expander 216, in accordance with an appropriate expansion characteristic which is suitable for normally controlling both the variable impedance elements 112 and 122. The operation of the converter 100 has already been explained with reference to FIG. 1. The feedback circuit 212 controls the variable impedance elements 112 and 122 so as to increase or decrease the level of the input signal $S_{in}$ when the level of the pilot signal decreases or increases, respectively, due to, for example a fading. Thus, the feedback loop, which is formed between the output of the amplifier 210 and the control terminal 160, acts as a negative feedback loop. As already mentioned, the converter 100 creates twice the conversion ratio which is obtained by using the inverted L-type variable attenuator such as the first variable level converting unit 110. Accordingly, the P-AGC circuit 200 succeeds in providing twice the automatic-gain-controlled dynamic range which is provided by a conventional P-AGC circuit comprised of the inverted L-type variable attenuator. At the same time, the P-AGC circuit 200 produces no second-order non-linear distortion.

Figure 3:
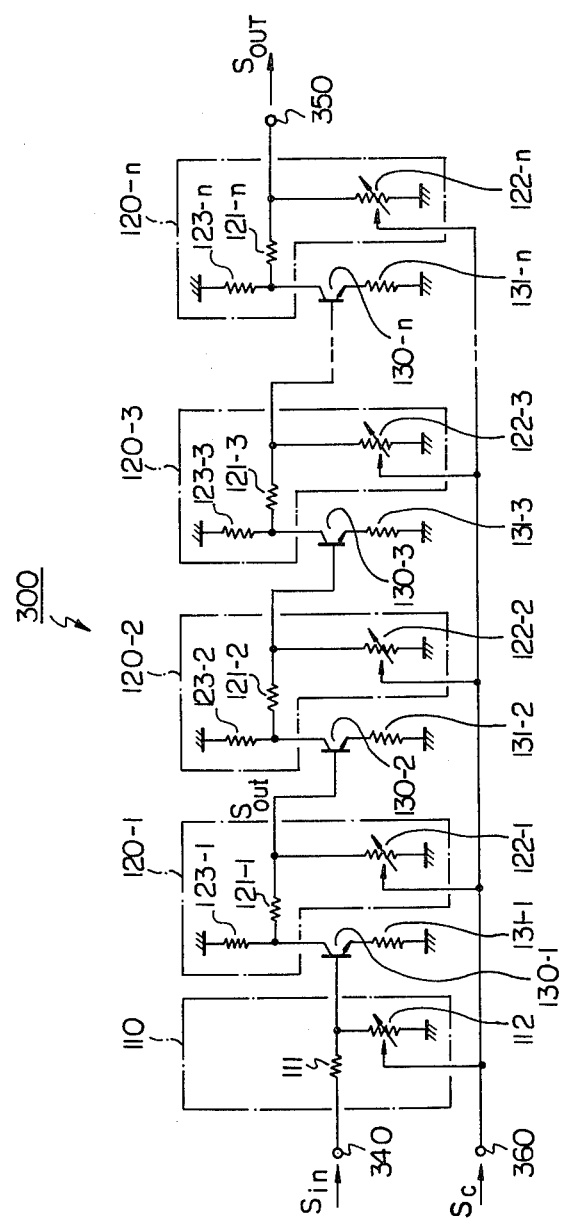
FIG. 3 illustrates a circuit diagram of a second embodiment of a variable level converter, according to the present invention.

The level conversion ratio can easily be expanded at will by forming a multiple-stage variable level converter, based on the converter 100 of FIG. 1. In FIG. 3, which illustrates a circuit diagram of a second embodiment of a variable level converter, the multiple-stage variable level converter 300 the first variable level converting unit 110 (see FIG. 1), "n" second variable level converting units 120-1, 120-2, 120-3 . . . 120-n (refer to the second variable level converting unit 120 of FIG. 1) and "n" amplifying transistors 130-1, 130-2, 130-3 . . . 130-n (refer to the amplifying transistor 130 of FIG. 1). The fixed resistors 111 of FIGS. 3 and 1 are identical. The first variable impedance elements 112 of FIGS. 3 and 1 are identical. Each of the first fixed resistors 121-1, 121-2, 121-3 . . . 121-n of FIG. 3 and the first fixed resistor 121 are identical. Each of second variable impedance elements 122-1, 122-2, 122-3 . . . 122-n of FIG. 3 and the second variable impedance element 122 of FIG. 1 are identical. Each of the second fixed resistors 123-1, 123-2, 123-3 . . . 123-n of FIG. 3 and the second fixed resistor 123 of FIG. 1 are identical. Each of the fixed resistors 131-1, 131-2, 131-3 . . . 131-n of FIG. 3 and the fixed resistor 131 of FIG. 1 are identical. The reference numerals 340, 350 and 360, respectively represent an input terminal, an output terminal and a control terminal. Signals $S_{in}$ and $S_c$ of FIG. 3 are identical with the signals $S_{in}$ and $S_c$ of FIG. 1. The reference symbol $S_{OUT}$ is an output signal which is different from the above mentioned output signal $S_{out}$.

When each of the variable level converting units 120-1, 120-2, 120-3 . . . 120-n is comprised of the respective variable impedance elements having the same electric characteristics, the following equation (15) is obtained.

$$RV_1 = RV_{2-1} = RV_{2-2} = RV_{2-3} \ldots RV_{2-n} = RV_c \quad (15)$$

The meaning of these symbols is similar to the meaning of the corresponding symbols occuring in equation (4).

The resistance values of the resistors 111, 121-1 through 121-n and 123-1 through 123-n should be selected so as to satisfy the following equation (16).

$$R_1 = RL_1 + R_{2-1} = RL_2 + R_{2-2} = RL_3 + R_{2-3} \ldots$$
$$= RL_n + R_{2-n} = R_c \quad (16)$$

The meaning of these symbols is similar to the meaning of the corresponding symbols occuring in the equation (5).

Therefore, the total transfer function $f(RV_1 \ldots RV_n)$ is expressed by the following equation (17)

$$f(RV_1 \ldots RV_n) = \quad (17)$$

$$\left( \frac{RL_1}{R_{e1}} \cdot \frac{RL_2}{R_{e2}} \cdot \ldots \cdot \frac{RL_n}{R_{en}} \right) \cdot \left( \frac{RV_c}{R_c + RV_c} \right)^{n+1}$$

The meaning of these symbols is similar to the meaning of the corresponding symbols occuring in equation (6). Since the grounded-emitter type amplifiers in respective variable level converting units 120-l through 120-n have identical characteristics, each of the collector resistors (RL) of the transistors 130-l through 130-n and each of the emitter resistors ($R_e$) thereof satisfy the following equations (18) and (19)

$$RL_1 = RL_2 = RL_3 \ldots RL_n = RL_c \quad (18)$$

$$R_{e1} = R_{e2} = R_{e3} \ldots R_{en} = R_{ec} \quad (19)$$

Therefore, the equation (17) can be replaced by the following equation (20).

$$f(RV_1 \ldots RV_n) = \left( \frac{RL_c}{R_{ec}} \right)^n \cdot \left( \frac{RV_c}{R_c + RV_c} \right)^{n+1} \quad (20)$$

As will be understood from equation (20), the conversion ratio of the converter 300 becomes (n+1) times the conversion ratio which is obtained by using the single inverted L-type variable attenuator.

Departing from equation (20), suppose that each gain $$\left( \frac{RL_1}{R_{e1}}, \frac{RL_2}{R_{e2}}, \frac{RL_3}{R_{e3}} \ldots \frac{RL_n}{R_{en}} \right)$$

of the respective stages (120-1, 120-2, 120-3 . . . 120-n) is selected so as to satisfy the following equation (21).

$$\frac{RL_1}{R_{e1}} = \frac{RL_2}{R_{e2}} = \frac{RL_3}{R_{e3}} \ldots = \frac{RL_n}{R_{en}} = \frac{RV(0) + R_c}{RV(0)} \quad (21)$$

The symbol RV(0) represents a specified resistance value of each variable impedance element when a respective predetermined standard input voltage according to the so-called level diagram, is supplied thereto. Consequently, the equation (20) can be rewritten to become the following equation (22), by utilizing equation (21).

$$f(RV_1 \ldots RV_n) = \frac{RV(0)}{RV(0) + R_c} \quad (22)$$

As will be understood from equation (22), the transmission loss created between the input terminal 340 and the output terminal 350 is almost equal to the transission loss created by the first unit 110 (refer to the equation (1)). In other words, there is no transmission loss between the units 120-l through 120-n. Accordingly, the above mentioned level diagram between the units 120-l through 120-n does not change. As a result, during the application of the predetermined standard input voltage to each unit (120-l through 120-n), the levels of the signals applied to the respective variable impedance elements 122-1 through 122-n are the same, and thereby the previously mentioned condition stated in paragraph (3) can be satisfied. Also, the phases of the signals appearing in each two adjacent units (110, 120-1), (120-1, 120-2) . . . (120-(n-1), 120-n) are opposite to each other by 180°, and accordingly the previously mentioned condition stated in paragraph (4) can be satisfied. Thus, the second-order non-linear distortion cannot be provided from the output terminal 350.

Figure 4:
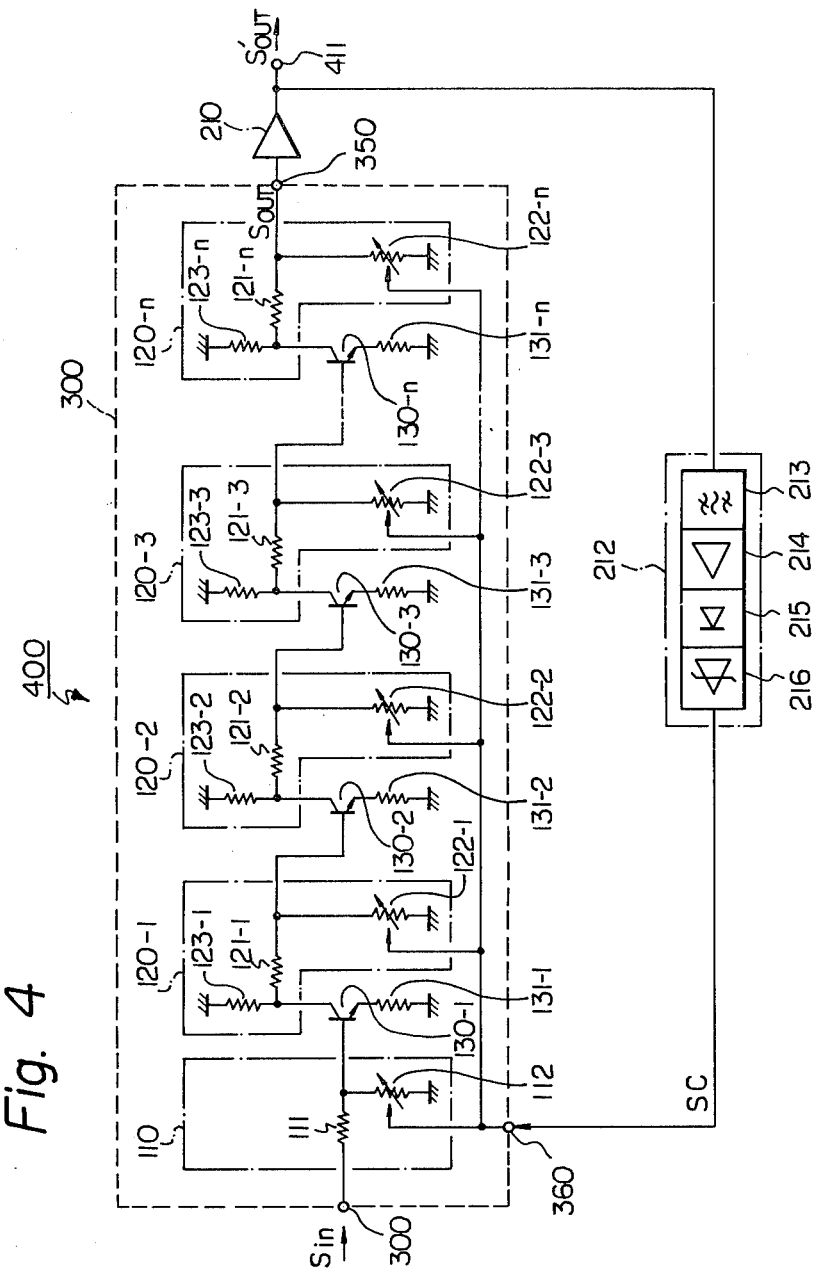
FIG. 4 illustrates a circuit diagram of a P-AGC circuit which is constructed by utilizing the variable level converter shown in FIG. 3.

The variable level converter 300 may also preferably be employed in an AGC circuit. The AGC circuit which utilizes the converter 300 is illustrated in FIG. 4. Thus AGC circuit 400 is especially directed to the P-AGC (Pilot signal AGC) circuit. In FIG. 4, members which have the same reference numerals or symbols as those shown in FIGS. 2 and 3 are identical with each other. An amplified signal $S_{OUT}$ from the amplifier 210 is, on the one hand, produced as an output signal $S'_{OUT}$, from an output terminal 411, and, on the other hand, applied to the feedback circuit 212. The operation of the converter 300 has already been explained by referring to FIG. 3. As has already been mentioned, the converter 300 attains (n+1) times the conversion ratio which is obtained by using the inverted L-type variable attenuator, such as first variable level converting unit 110. Accordingly, the P-AGC circuit 400 succeeds in providing n times the automatic-gain-controlled dynamic range which will be provided by a conventional P-AGC circuit comprised of the inverted L-type variable attenuator. At the same time, the P-AGC circuit 400 produces no second-order non-linear distortion, if equation ㉒ is also satisfied.

As mentioned above, the variable level converter of the present invention can provide a very wide dynamic range of level conversion, when compared to the dynamic range of the levels obtained by using the conventional inverted L-type variable attenuator. Further, although the variable level converter of the present invention provides a very wide dynamic range, it produces almost no second-order non-linear distortion, by suitably choosing the circuit elements so as to satisfy the aforesaid equations. Thus, the variable level converter will be very useful for the AGC circuit employed in microwave transmitting and receiving systems or a satellite communication system, where the AGC circuit is required to attain a very wide range of level conversion without inducing second-order non-linear distortion.

What is claimed is:

1. A variable level converter, for converting an input signal of a first level to an output signal of a second level, comprising:
   means for providing a level control signal;
   a first variable level converting unit, operatively connected to said means for providing a level control signal, for receiving the input signal;
   a circuit stage, operatively connected to said first variable level converting unit and said means for providing a level control signal, for producing the output signal, said circuit stage comprising a single amplifying transistor operatively connected to said first variable level converting unit and a second variable level converting unit, having an output operatively connected to said amplifying transistor, for producing the output signal at said output, said first and second variable level converting units having the same transfer function;
   said first variable level converting unit comprising:
      a first resistor operatively connected to receive the input signal and operatively connected to said amplifying transistor; and
      a first variable impedance element, operatively connected to said first resistor, said amplifying transistor and said means for providing said level control signal, so that the impedance of said first vriable impedance element is varied in dependence upon said said level control signal;
   said second variable level converting unit comprising:
      a second resistor operatively connected to said amplifying transistor;
      a third resistor operatively connected to second resistor, said amplifying transistor and said output; and
      a second variable impedance element, operatively connected to said third resistor, said output and said means for providing said level control signal, so that the impedance of said variable impedance element varies in dependence upon said level control signal, said first and second variable impedance elements having identical electric characteristics;
   said means for providing a level control signal including a negative feedback circuit comprising:
      a pilot filter, operatively connected to the output of said second variable level converting unit, for extracting a pilot signal;
      a pilot signal amplifier operatively connected to said pilot filter;
      a rectifier circuit, operatively connected to said pilot signal amplifier; and
      an expanded circuit, operatively connected to said rectifier and operatively connected to said first and second variable impedance elements, for providing said level control signal.

2. A variable level converter, for converting an output signal of a first level to an output signal of a second level, comprising:
   means for providing a level control signal;
   a first variable level converting unit, operatively connected to said means for providing a level control signal, for receiving the input signal;
   a first circuit stage, operatively connected to said first variable level converting unit and said means for providing a level control signal, said first circuit stage comprising a single amplifying transistor operatively connected to said first variable level converting unit; and
   a second variable level converting unit having an output operatively connected to said amplifying transistor, for producing the output signal at said output, said first and second variable level converting units having the same transfer function; and
   a plurality of circuit stages operatively connected in series to said output of said second variable level converting unit, the last of said plurality of circuit stages providing the output signal;
   said first variable level converting unit comprising:
      a first resistor operatively connected to receive the input signal and operatively connected to said amplifying transistor; and
      a first variable impedance element, operatively connected to said first resistor, said amplifying transistor and said means for providing said level control signal, so that the impedance of said first variable impedance element is varied in dependence upon said level control signal;
   said second varible level converting unit comprising:
      a second resistor operatively connected to said amplifying transistor;
      a third resistor operatively connected to said second resistor, said amplifying transistor and said output; and
      a second variable impedance element, operatively connected to said third resistor, said output and said means for providing said level control signal, so that the impedance of said variable impedance element varies in dependence upon said level control signal, said first and second variable impedance elements having identical electric characteristics;
   said means for providing said level control signal including a negative feedback circuit operatively connected to the output of the last of said plurality of circuit stages, for providing said level control signal to said first and second variable impedance elements and to each of the variable impedance elements in said plurality of circuit stages, said negative feedback circuit comprising:

a pilot filter, operatively connected to the output of the last of said plurality of circuit stages, for extracting a pilot signal;

a pilot signal amplifier, operatively connected to said pilot filter;

a rectifier circuit operatively connected to said pilot signal amplifier; and an expander circuit, operatively connected to said rectifier circuit and operatively connected to said first and second variable impedance elements and to each of the variable impedance elements in said plurality of circuit stages, for providing said level control signal.

* * * * *

UNITED STATES PATENT AND TRADEMARK OFFICE
CERTIFICATE OF CORRECTION

PATENT NO. : 4,320,348
DATED : March 16, 1982
INVENTOR(S) : SHINJIRO SUZUKI ET AL.

It is certified that error appears in the above—identified patent and that said Letters Patent is hereby corrected as shown below:

```
Front page, [73] Assignee, "Kanagawa" should be
                --Kawasaki--;
           [56] References Cited, under "OTHER
                PUBLICATIONS", line 2, "vol."
                should be --Vol.--.
Column 2, line 28, "amplified" should be --amplifier--.
Column 3, line 61, "state" should be --stated--.
Column 4, line 41, delete "phase with" (both occurrences).
Column 6, line 7, delete "of the level";
          line 30, delete "the" (second occurrence).
Column 7, line 6, after "300", insert --comprises--.
Column 10, line 51, "varible" should be --variable--.
```

Signed and Sealed this

Twenty-fourth Day of August 1982

|SEAL|

Attest:

GERALD J. MOSSINGHOFF

*Attesting Officer*   *Commissioner of Patents and Trademarks*